United States Patent [19]

Kimura et al.

[11] Patent Number: 5,237,286
[45] Date of Patent: Aug. 17, 1993

[54] METHOD AND APPARATUS FOR GENERATION OF HIGH FREQUENCY PULSES

[75] Inventors: Mistuyoshi Kimura, Katsuta; Masahiro Akatsu, Ibaraki, both of Japan

[73] Assignee: Hitachi, Ltd., Tokyo, Japan

[21] Appl. No.: 984,251

[22] Filed: Dec. 1, 1992

Related U.S. Application Data

[63] Continuation of Ser. No. 505,180, Apr. 5, 1990, abandoned.

[30] Foreign Application Priority Data

Apr. 14, 1989 [JP] Japan .................................... 1-92859

[51] Int. Cl.$^5$ ...................... H03B 19/00; H04B 15/00
[52] U.S. Cl. ..................................... 328/14; 328/158; 307/529; 332/151; 455/314
[58] Field of Search ..................... 328/14, 15, 16, 158, 328/160, 59, 60, 61; 307/271, 529, 261, 268; 332/151, 152, 153, 154; 375/38, 39, 40; 455/102, 314, 315, 323

[56] References Cited

U.S. PATENT DOCUMENTS

| | | | |
|---|---|---|---|
| 2,963,933 | 12/1960 | Bereskin | 307/529 |
| 3,030,449 | 4/1962 | Geneve | 332/151 |
| 3,649,922 | 3/1972 | Ralph et al. | 328/60 |
| 4,494,073 | 1/1985 | Sorgi | 307/529 |
| 5,045,799 | 9/1991 | Holecek | 328/14 |

Primary Examiner—William L. Sikes
Assistant Examiner—Toan Tran
Attorney, Agent, or Firm—Antonelli, Terry, Stout & Kraus

[57] ABSTRACT

A method and apparatus for generation of high frequency pulses and for excitation of nuclear magnetic resonance of a sample generates a plurality of modurated high frequency waves having different frequencies from each other, and combines the generated these high frequency waves so as to generate high frequency pulses which provide a frequency spectrum having a predetermined band, thereby a shortening of the high frequency pulse width as well as a narrowing of the frequency band is achieved.

36 Claims, 3 Drawing Sheets

METHOD AND APPARATUS FOR GENERATION OF HIGH FREQUENCY PULSES

This application is a continuation of application Ser. No. 07/505,180, filed Apr. 5, 1990, now abandoned.

BACKGROUND OF THE INVENTION

(1) Field of the Invention

The present invention relates to a method and apparatus for generation of a high frequency pulse and for excitation of nuclear magnetic resonance of a sample and, in particular, relates to the above method and apparatus suitable for nuclear magnetic resonance imaging and nuclear magnetic resonance analysis.

(2) Prior Art

In the nuclear magnetic resonance imaging and the nuclear magnetic resonance analysis, a high frequency pulse is typically applied to the sample for excitation of nuclear magnetic resonance of the sample.

According to the well known technique, a high frequency or radio frequency wave (carrier wave) having a predetermined frequency is modulated with a modulation wave defined by a sinc function both ends of which are restricted in order to have a time width T and thereby while centering the above frequency, a high frequency pulse is generated which provides a frequency spectrum having a frequency band inversely proportional to the time width T.

However, since the time width of the modulation wave and the frequency band of the frequency spectrum are inversely proportional to each other, it was difficult to simultaneously satisfy both shortening of the time width of the modulation wave and hence the high frequency pulse width (which indicates radiation time on the sample with the high frequency pulse) and narrowing of the frequency band.

SUMMARY OF THE INVENTION

An object of the present invention is to provide a method and apparatus for generation of a high frequency pulse and for excitation of nuclear magnetic resonance of a sample which are suitable for making the shortening of the high frequency pulse compatible with the narrowing of the frequency band.

According to the present invention, a plurality of modulated high frequency waves are generated which have different frequencies from each other, and the generated high frequency waves are so combined as to generate a high frequency pulse which provides a frequency spectrum having a predetermined band.

By obtaining the high frequency pulse through the combination of the plurality of the modulated high frequency waves having different frequencies from each other, the frequency band of the frequency spectrum provided by the respective high frequency waves can be made broader than the frequency band of the frequency spectrum provided by the obtained high frequency pulse, whereby the compatibility of the shortening of the high frequency pulse width with the narrowing of the frequency band is achieved.

The foregoing objects and features and other objects and features of the present invention will become apparent from the following explanation which is made with reference to the attached drawings.

EXPLANATION OF THE PREFERRED EMBODIMENTS

Figure 1:
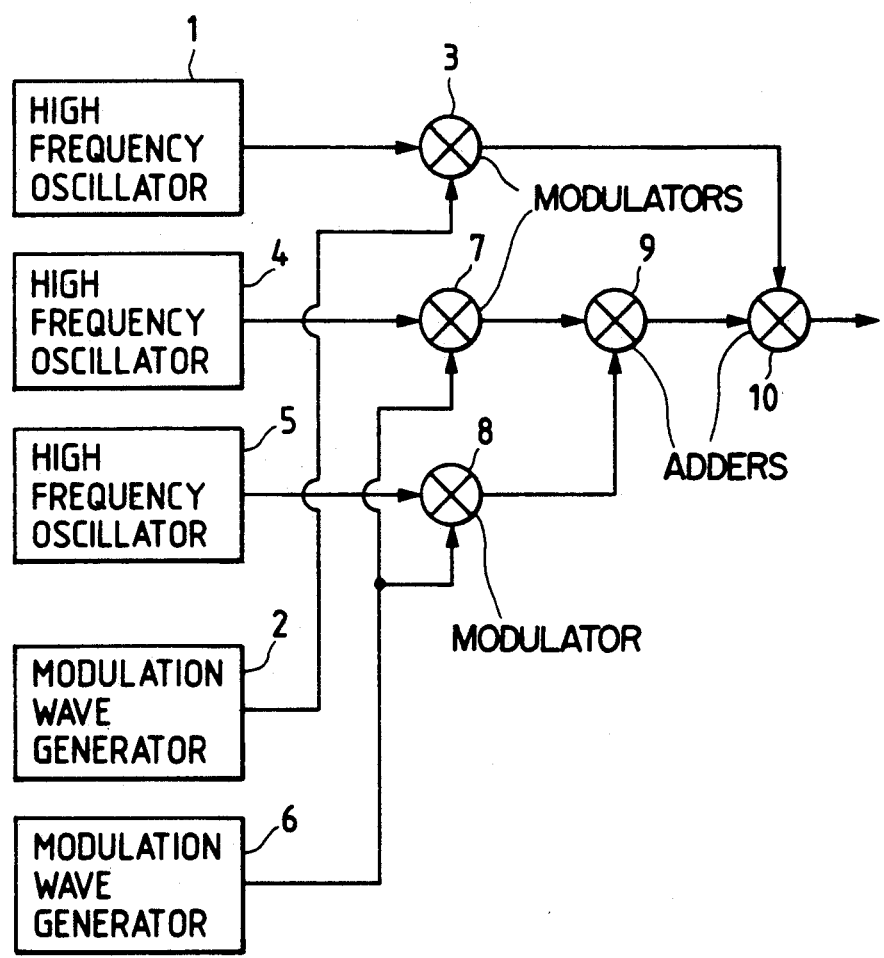
FIG. 1 is a block diagram of one embodiment of a high frequency pulse generation circuit according to the present invention.

Referring to FIG. 1, a first radio frequency wave or high frequency wave (carrier wave) generated by a high frequency oscillator 1 is amplitude-modulated in a modulator 3 with a first modulation wave generated by a modulation wave generator 2. Second and third radio frequency waves or high frequency waves (carrier waves) generated by high frequency oscillators 4 and 5 are respectively amplitude-modulated in modulators 7 and 8 with a second modulation wave generated by a modulation wave generator 6 and the modulated second and third high frequency waves are added to each other by an adder 9. The output of the adder 9 is added to the output from the modulator 3 by an adder 10.

Figure 2:
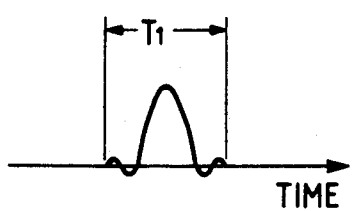
FIG. 2 and FIG. 3 are views each illustrating one example of a modulation wave used in the embodiment of FIG. 1.
Figure 3:
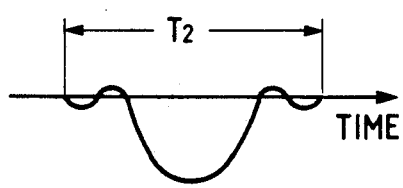

Sinc function waves as shown in FIG. 2 and FIG. 3 are used as the first and second modulation waves. Although the polarities of the sinc function waves shown in FIG. 2 and FIG. 3 are opposite to each other, the both ends of the both sinc function waves are cut so as to each include only a main lobe and two pairs of side lobes at its both ends within respective time intervals $T_1$ and $T_2$.

When the first high frequency wave is amplitude-modulated with the modulation wave of the since function as shown in FIG. 2, the first high frequency pulse having the time width $T_1$ is obtained, and when the second and third high frequency waves are amplitude-modulated with the modulation wave of the sinc function as shown in FIG. 3, the second and third high frequency pulses having the time width $T_2$ are obtained. Therefore, the second and the third high frequency pulses are added by the adder 9, and the output of the adder 9 is added to the first high frequency pulse by the adder 10, so that a high frequency pulse having a time width $T_2$ obtained by synthesizing the first, second, and third high frequency pulses is outputted from the adder 10. Accordingly, the first, second, and third high frequency pulses are called component high frequency pulses with reference to the high frequency pulse of the output signal from the adder 10.

Figure 5:
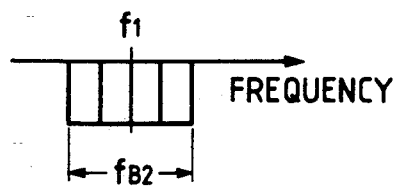
FIG. 4, FIG. 5, FIG. 6 and FIG. 7 are views each illustrating one example of frequency spectrum provided by the high frequency pulse used in the embodiment in FIG. 1.
Figure 6:
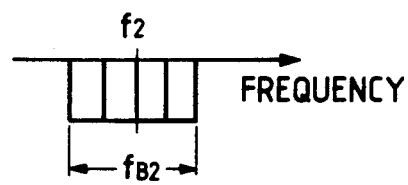
Figure 4:
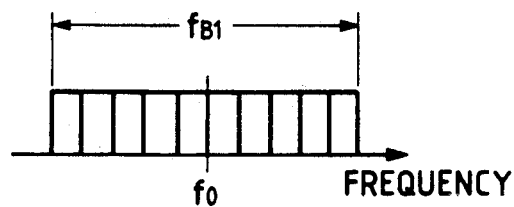

Assuming that the frequency of the first high frequency wave is fo and this high frequency wave is modulated with the sinc function wave shown in FIG. 2, the first high frequency pulse thus obtained provides a frequency spectrum of substantially rectangular shape having a frequency band of $f_{B1}$ while centering fo as shown in FIG. 4. Likely, assuming that the frequency of the second and third high frequency waves are $f_1$ and $f_2$ and these high frequency waves are modulated with the sinc function wave shown in FIG. 3, the second and third high frequency pulses thus obtained provide respectively frequency spectra of substantially rectangular shape having a frequency band $f_{B2}$ while centering $f_1$ and $f_2$ as shown in FIG. 5 and FIG. 6. Accordingly, the high frequency pulse obtained by synthesizing the first, second and third high frequency pulses also provides a frequency spectrum of substantially rectangular shape.

Figure 7:
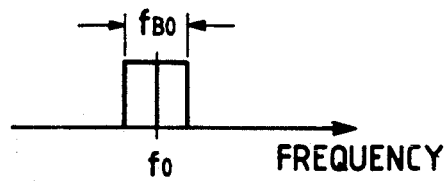

For example, assuming that $T_2=2.5T_1$; $f_1=f_0-3f_{B0}/2$, $f_2=f_0+3f_{B0}/2$, $f_{B1}=5f_{B0}$, and $f_{B2}=2f_{B0}$, the synthesized pulse provides a frequency spectrum as shown in FIG. 7, that is, a frequency spectrum having the central frequency of $f_0$ and the frequency band of $f_{B0}$.

In contrast, when a high frequency pulse is simply obtained by modulating the high frequency wave having the frequency of $f_0$ with, for example, a sinc function wave of FIG. 3 as in conventional art, the frequency band $f_{B3}$ of the frequency spectrum obtained thereby having the center frequency of $f_0$ is proportional to $1/T_2$, and, since $T_2=2.5T_1$, and $f_{B1}$ ($=5f_{B0}$) which is proportional to $1/T_1$, $f_{B3}$ become $2f_{B0}$.

From the above facts, it will be understood according to the above example of the present invention, the frequency spectrum having the frequency band $f_{B0}$ is obtained in time $T_2$, but with the conventional method, the frequency band of the frequency spectrum obtained in time of $T_2$ is twice broader than the example of the present invention. In other words, in the conventional method, time of $2T_2$ is needed for obtaining the frequency spectrum having the frequency band $f_{B0}$, while in the example of the present invention half of the time is needed, and accordingly, when selecting $T_1$, $T_2$, $f_{B1}$, and $f_{B2}$ properly, the shortening of the time as well as the narrowing of the frequency band may be achieved.

The number of high frequency waves to be combined is three in the embodiment as first, second and third high frequency waves. However the number is not restricted to the three and may be two. Further, the second and the third high frequency waves in the above embodiment may be modulated by sinc function waves of different time width. Further, though in the embodiment the polarity of the second modulation wave is opposite to that of the first modulation wave, this polarity inverting may be performed after the modulation, not at the stage of the modulation wave generation. Furthermore while maintaining the polarities as the same, and using a subtracter in place of the adder 10, the difference of both these input signals may be taken. Still further, a Gaussian wave or a rectangular wave other than the sinc function wave may be used as the modulation wave.

Figure 8:
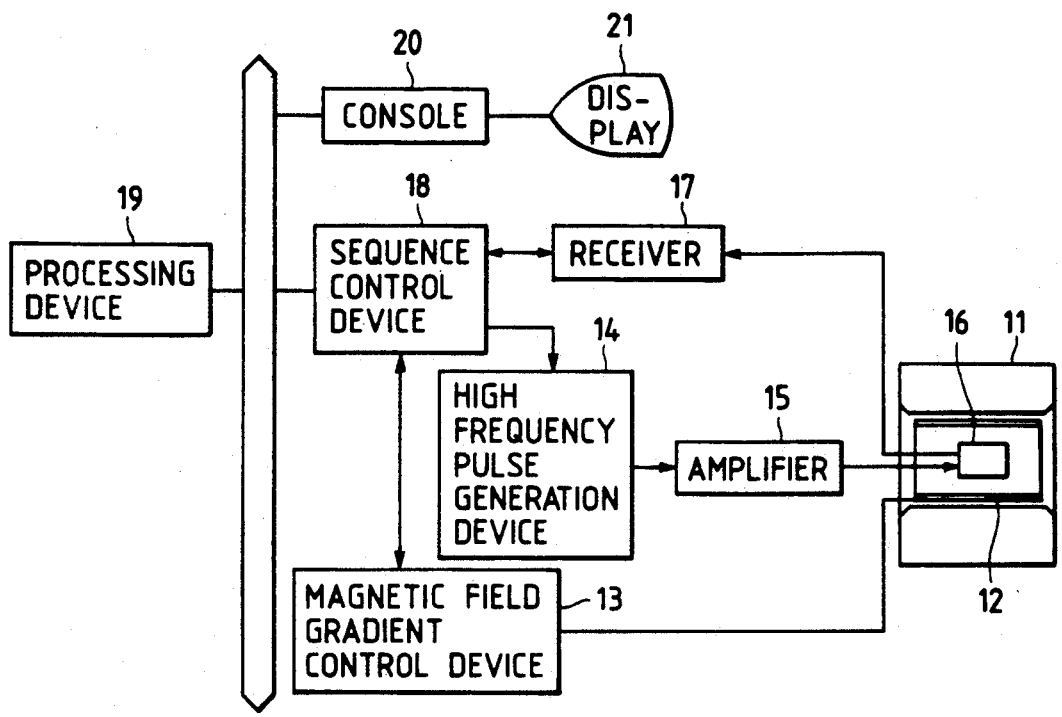
FIG. 8 is a block diagram of one embodiment of a nuclear magnetic resonance imaging device incorporating the embodiment of FIG. 1.

Referring to FIG. 8, a static magnetic field generation device 11 into which samples are inserted, may be either of a superconductivity type, an electromagnetic type and a permanent magnetic type. In the static magnetic field generation device 11 a gradient magnetic field coil 12 is disposed so as to surround a sample, and is connected to a magnetic field gradient control device 13 which controls the application of the gradient magnetic field in the x, y and z directions to the static magnetic field generated by the static magnetic field generation device 11. A high frequency pulse generation device 14 is the same as that shown in FIG. 1 and is connected to a transmitter-receiver coil 16 through an amplifier 15 so as to apply the high frequency pulse generated thereby to the sample. To the transmitter-receiver coil 16 also a receiver 17 is connected for receiving a nuclear magnetic resonance signal obtained from the sample.

A sequence control device 18 is connected to the magnetic field gradient control device 13, the high frequency pulse generation device 14, and the receiver 17, and controls the respective timings of generation of the high frequency pulses, of generation of the gradient of magnetic field in the x, y, and z directions, and of reception of the nuclear magnetic resonance signal. The sequence control device 18 also functions to have a data processing device 19 carried out an image reconstruction based on the nuclear magnetic resonance signal received at the receiver 17 and a display device 21 displayed an image through a console 20 which performs transmission and reception of information.

Figure 9:
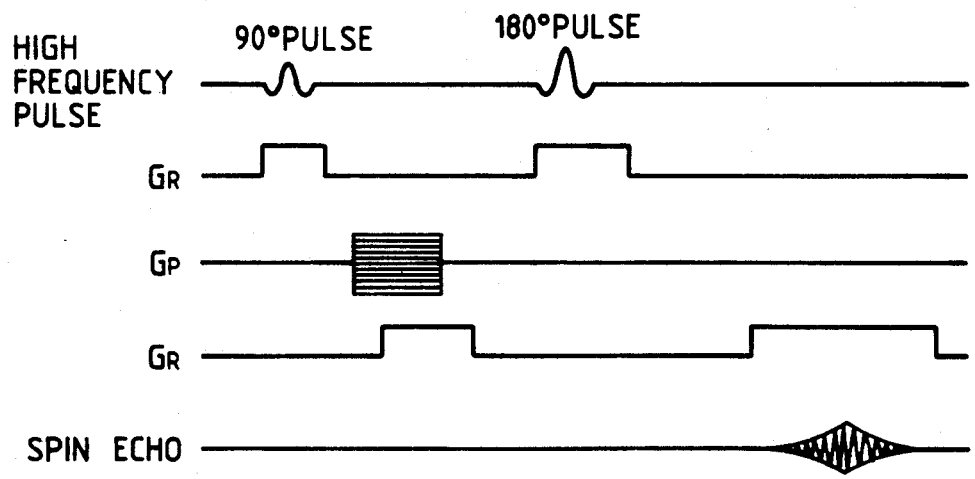
FIG. 9 is a view illustrating one example of pulse sequence used in the embodiment of FIG. 8.

Referring to FIG. 9, a selective high frequency 90° pulse is applied under the existence of a magnetic field gradient Gs in the Z axis direction for slice selection use. Thereby, a slice perpendicular to the Z axis is selected. Namely, the nuclear spins in the slice are nutated by 90°. Thus the nutated spins are gradually dispersed.

Following above, a selective high frequency 180° pulse is applied under the existence of the magnetic field gradient Gs, thereby the nuclear spins in the slice are inverted. The dispersed nuclear spins are gradually converged, and the nuclear magnetic resonance signal called a spin echo are generated from the whole of the slice.

Between the selective high frequency 90° pulse and the selective high frequency 180° pulse a magnetic field gradient Gp in the Y axis direction for phase encoding use is applied, and further, after the application of the selective high frequency 180° pulse, a magnetic field gradient $G_R$ in the X direction for read-out use is applied, and during that time the spin echo signal is read.

The above step is repeated N times so as to generate N spin echo signals, wherein Gp is changed at every time so that its time integration changes at a predetermined rate.

For the respective spin echo signals, N samplings are applied, and the N spin echo signals each consisting of the respective signals sampled are subject to two dimensional Fourier transformation processing. Thereby, a two dimensional nuclear magnetic resonance signal image of the slice of the X-Y plane is obtained.

The magnetic field gradient $G_R$ for readout use is also applied between the both selective high frequency pulses. This application is made for compensating for dephase of the nuclear spins caused by the earlier half of the magnetic field gradient $G_R$ which is applied after the application of the selective high frequency 180° pulse.

From the above explanation, it will be apparent that the present invention provides a method and apparatus for generation of high frequency pulses and for excitation of nuclear magnetic resonance of a sample which are suitable for shortening of high frequency pulse width as well as narrowing of frequency band.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

We claim:

1. A high frequency pulse generation method comprising the steps of:

generating a first component high frequency pulse providing a frequency spectrum having a first frequency band and a second component high frequency pulse providing a frequency spectrum having a narrower frequency band than said first frequency band; and combining said first and second component high frequency pulses by subtracting said second component high frequency pulse from said first component high frequency pulse so as to generate a high frequency pulse providing a frequency spectrum having a narrower frequency band than said first and second frequency bands.

2. A high frequency pulse generation method according to claim 1, wherein said first and second component high frequency pulses are obtained by modulating first and second high frequency waves with first and second modulation waves, respectively.

3. A high frequency pulse generation method comprising the steps of:

generating a first high frequency pulse providing a frequency spectrum having a first frequency band and second and third high frequency pulses, the respective frequency bands of which are other than a predetermined center frequency band in said first frequency band and respectively broader than said predetermined center frequency band and respectively correspond to the frequency band on the lower frequency side of said first frequency band and to the frequency band on the higher frequency side thereof; and combining said first, second and third high frequency pulses by subtracting said second and third high frequency pulses from said first high frequency pulse so as to generate a high frequency pulse providing a frequency spectrum having substantially the same frequency band as said predetermine center frequency band in said first frequency band.

4. A high frequency pulse generation method according to claim 3, wherein said first high frequency pulse is obtained by modulating a first high frequency wave with a first modulation wave and said second and third high frequency pulses are obtained by modulating second and third high frequency wave having frequencies different from the frequency of said first high frequency wave and from each other with a second modulation wave.

5. A high frequency pulse generation apparatus comprising:

means for generating a first component high frequency pulse providing a frequency spectrum having a first frequency band and a second component high frequency pulse providing a frequency spectrum having a narrower frequency band than said first frequency band; and means for combining said first and second component high frequency pulses by subtracting said second component high frequency pulse from said first component high frequency pulse so as to generate a high frequency pulse providing a frequency spectrum having a narrower frequency band than said first and second frequency bands.

6. A high frequency pulse generation apparatus comprising:

means for generating a first high frequency pulse providing a frequency spectrum having a first frequency band and second and third high frequency pulses, the respective frequency bands of which are other than a predetermined center frequency band in said first frequency band and respectively broader than said predetermined center frequency band and respectively correspond to the frequency band on the lower frequency side of said first frequency band and to the frequency band on the higher frequency side thereof; and means for combining said first, second and third high frequency pulses by subtracting said second and third high frequency pulses from said first high frequency pulse so as to generate a high frequency pulse providing a frequency spectrum having substantially the same frequency band as said predetermined center frequency band in said first frequency band.

7. A high frequency pulse generation apparatus according to claim 6, wherein the width of the frequency bands in the frequency spectra provided by said high frequency pulses and corresponding to the frequency bands on both sides of said center frequency band are substantially the same.

8. A high frequency pulse generation apparatus according to claim 6 or claim 7, wherein said high frequency pulse generating means comprises means for generating first, second and third high frequency waves having frequencies different from each other; means for generating first and second modulation waves; and means for modulating said first high frequency wave with said first modulation wave for obtaining said first high frequency pulse and said second and third frequency waves with said second modulation waves for obtaining said second and third high frequency pulses.

9. A high frequency pulse generation method according to claim 1, further comprising the steps of disposing a sample in a static magnetic field, and applying the high frequency pulse to the sample to excite nuclear magnetic resonance of the sample.

10. A high frequency pulse generation method according to claim 9, further comprising the step of providing a magnetic field gradient to the static magnetic field and applying the high frequency pulse to the sample disposed in the static magnetic field with the magnetic field gradient applied to excite nuclear magnetic resonance of the sample.

11. A high frequency pulse generation apparatus according to claim 5, further comprising means for generating a static magnetic field for a sample disposed in the static magnetic field, and means for applying the generated high frequency pulse to the sample disposed in the static magnetic field to excite nuclear magnetic resonance of the sample.

12. A high frequency pulse generation apparatus according to claim 11, further comprising means for providing a magnetic field gradient to the static magnetic field generated by the static magnetic field generating means, the means for applying the high frequency pulse to the sample disposed in the static magnetic field enabling excitation of nuclear magnetic resonance of the sample under the existence of the magnetic field gradient.

13. A high frequency pulse generation method according to claim 2, wherein the first and second modulation waves have a time width which is inversely proportional to the frequency band of the frequency spectrum of the first and second component high frequency pulses, respectively.

14. A high frequency pulse generation method according to claim 2, wherein the first and second modulation waves utilize a sinc function.

15. A high frequency pulse generation apparatus according to claim 8, wherein at least the first and second modulation waves have a time width which is inversely proportional to the frequency band of the frequency spectrum of the first and second high frequency pulses, respectively.

16. A high frequency pulse generation apparatus according to claim 8, wherein at least said first and second modulation waves utilize a sinc function.

17. A high frequency pulse generation method comprising the steps of:
generating a first component high frequency pulse providing a frequency spectrum having a first frequency band and a second component high frequency pulse providing a frequency spectrum having a narrower frequency band than said first frequency band; and
combining said first and second component high frequency pulses so as to generate a high frequency pulse providing a frequency spectrum having a narrower frequency band than said first and second frequency bands.

18. A high frequency pulse generation method according to claim 17, wherein said first and second component high frequency pulses are obtained by modulating first and second high frequency waves with first and second modulation waves, respectively.

19. A high frequency pulse generation method according to claim 18, wherein the first and second modulation waves have a time width which is inversely proportional to the frequency band of the frequency spectrum of the first and second component high frequency pulses, respectively.

20. A high frequency pulse generation method according to claim 18, wherein the first and second modulation waves utilize a sinc function.

21. A high frequency pulse generation method according to claim 17, further comprising the steps of disposing a sample in a static magnetic field, and applying the high frequency pulse to the sample to excite nuclear magnetic resonance of the sample.

22. A high frequency pulse generation method according to claim 21, further comprising the step of providing a magnetic field gradient to the static magnetic field and applying the high frequency pulse to the sample disposed in the static magnetic field with the magnetic field gradient applied so as to excite nuclear magnetic resonance of the sample.

23. A high frequency pulse generation method according to claim 22, wherein the step of applying the high frequency pulse to excite nuclear magnetic resonance of the sample includes applying the high frequency pulse as a 90° pulse and a 180° pulse.

24. A high frequency pulse generation method according to claim 23, further comprising the steps of obtaining a nuclear magnetic resonance signal as a spin echo of the excited sample.

25. A high frequency pulse generation method according to claim 24, further comprising the step of deriving a nuclear magnetic resonance signal image of the sample in accordance with the obtained nuclear magnetic resonance signal.

26. A high frequency pulse generation apparatus comprising:

means for generating a first component high frequency pulse providing a frequency spectrum having a first frequency band and a second component high frequency pulse providing a frequency spectrum having a narrower frequency band than said first frequency band; and
means for combining said first and second component high frequency pulses so as to generate a high frequency pulse providing a frequency spectrum having a narrower frequency band than said first and second frequency bands.

27. A high frequency pulse generation apparatus according to claim 26, wherein the means for generating the first and second component high frequency pulses includes first and second generating means for generating first and second high frequency waves, respectively, and first and second modulation means for modulating the first and second high frequency pulses with first and second modulation waves, respectively.

28. A high frequency pulse generation apparatus according to claim 27, wherein the first and second modulation waves have a time width which is inversely proportional to the frequency band of the frequency spectrum of the first and second component high frequency pulses, respectively.

29. A high frequency pulse generation apparatus according to claim 27, wherein the first and second modulation waves utilize a sinc function.

30. A high frequency pulse generation apparatus according to claim 26, further comprising means for generating a static magnetic field for a sample disposed in the static magnetic field, and means for applying the generated high frequency pulse to the sample disposed in the static magnetic field to excite nuclear magnetic resonance of the sample.

31. A high frequency pulse generation apparatus according to claim 30, further comprising means for providing a magnetic field gradient to the static magnetic field generated by the static magnetic field generating means, means for applying the high frequency pulse to the sample disposed in the static magnetic field enabling excitation of the nuclear magnetic resonance of the sample under the existence of the magnetic field gradient.

32. A high frequency pulse generation apparatus according to claim 31, wherein the means for applying the generated high frequency pulse to excite nuclear magnetic resonance of the sample applies the high frequency pulse as a 90° pulse and a 180° pulse.

33. A high frequency pulse generation apparatus according to claim 32, further comprising means for obtaining a nuclear magnetic resonance signal as a spin echo of the excited sample.

34. A high frequency pulse generation apparatus according to claim 33, further comprising means for deriving a nuclear magnetic resonance signal image of the sample in accordance with the obtained nuclear magnetic resonance signal.

35. A high frequency pulse generation method comprising the steps of:
generating a first high frequency pulse providing a frequency spectrum having a first frequency band and second and third high frequency pulses, the respective frequency bands of which are other than a predetermined center frequency band in said first frequency band and respectively broader than said predetermined center frequency band and respectively correspond to the frequency band on the lower frequency side of said first frequency band and to the frequency band on the higher frequency side thereof; and combining said first, second and third high frequency pulses by subtracting said second and third high frequency pulses from said first high frequency pulse so as to generate a high frequency pulse providing a frequency spectrum having substantially the same frequency band as said predetermined center frequency band in said first frequency band.

36. A high frequency pulse generation apparatus comprising:

means for generating a first high frequency pulse providing a frequency spectrum having a first frequency band and second and third high frequency pulses, the respective frequency bands of which are other than a predetermined center frequency band in said first frequency band and respectively broader than said predetermined center frequency band and respectively correspond to the frequency band on the lower frequency side of said first frequency band and to the frequency band on the higher frequency side thereof; and means for combining said first, second and third high frequency pulses so as to generate a high frequency pulse providing a frequency spectrum having substantially the same frequency band as said predetermined center frequency band in said first frequency band.

* * * * *